(12) United States Patent
Kim et al.

(10) Patent No.: US 9,245,770 B2
(45) Date of Patent: Jan. 26, 2016

(54) SEMICONDUCTOR DEVICE AND METHOD OF SIMULTANEOUS MOLDING AND THERMALCOMPRESSION BONDING

(71) Applicant: STATS ChipPAC, Ltd., Singapore (SG)

(72) Inventors: KyungMoon Kim, Gyeonggi-do (KR); KooHong Lee, Seoul (KR); JaeHak Yee, Seoul (KR); YoungChul Kim, Kyoungki-di (KR); Lan Hoang, San Jose, CA (US); Pandi C. Marimuthu, Singapore (SG); Steve Anderson, San Ramon, CA (US); HeeJo Chi, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/038,339

(22) Filed: Sep. 26, 2013

(65) Prior Publication Data
US 2014/0175639 A1    Jun. 26, 2014

Related U.S. Application Data

(60) Provisional application No. 61/740,379, filed on Dec. 20, 2012.

(51) Int. Cl.
*H01L 23/48* (2006.01)
*H01L 23/52* (2006.01)
(Continued)

(52) U.S. Cl.
CPC .............. *H01L 21/56* (2013.01); *H01L 21/565* (2013.01); *H01L 23/3128* (2013.01);
(Continued)

(58) Field of Classification Search
USPC .................. 257/678–733, 787–796, 99, 737, 257/E21.502, 777, E23.116, E33.056, 738, 257/773, E21.509, E21.519, 782, E25.013, 257/E31.117, E33.059, 433; 33/678–733; 438/124, 127, 26, 108, 126, 109, 110, 438/112, 51, 64
See application file for complete search history.

(56) References Cited

U.S. PATENT DOCUMENTS 4,509,994 A    4/1985    Barajas
5,172,851 A    12/1992   Matsushita et al.
(Continued)

OTHER PUBLICATIONS

DS Hi-Metal Beyond Materials, DSHM Epoxy Flux EFSCH-026, Technical Data Sheet, Rev2, Aug. 1, 2011, 1 page.
(Continued)

*Primary Examiner* — Dao H Nguyen
*Assistant Examiner* — Tram H Nguyen
(74) *Attorney, Agent, or Firm* — Robert D. Atkins; Patent Law Group: Atkins and Associates, P.C.

(57) ABSTRACT

A semiconductor device has a semiconductor die disposed over a substrate. The semiconductor die and substrate are placed in a chase mold. An encapsulant is deposited over and between the semiconductor die and substrate simultaneous with bonding the semiconductor die to the substrate in the chase mold. The semiconductor die is bonded to the substrate using thermocompression by application of force and elevated temperature. An electrical interconnect structure, such as a bump, pillar bump, or stud bump, is formed over the semiconductor die. A flux material is deposited over the interconnect structure. A solder paste or SOP is deposited over a conductive layer of the substrate. The flux material and SOP provide temporary bond between the semiconductor die and substrate. The interconnect structure is bonded to the SOP. Alternatively, the interconnect structure can be bonded directly to the conductive layer of the substrate, with or without the flux material.

24 Claims, 13 Drawing Sheets

(51) Int. Cl.
*H01L 29/40* (2006.01)
*H01L 21/56* (2006.01)
*H01L 23/00* (2006.01)
*H01L 23/31* (2006.01)
*H01L 23/498* (2006.01)

(52) U.S. Cl.
CPC ... *H01L 23/49816* (2013.01); *H01L 23/49827* (2013.01); *H01L 24/11* (2013.01); *H01L 24/16* (2013.01); *H01L 24/81* (2013.01); *H01L 24/92* (2013.01); *H01L 24/03* (2013.01); *H01L 24/05* (2013.01); *H01L 24/13* (2013.01); *H01L 24/94* (2013.01); *H01L 2224/0345* (2013.01); *H01L 2224/03462* (2013.01); *H01L 2224/03464* (2013.01); *H01L 2224/0401* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16057* (2013.01); *H01L 2224/16058* (2013.01); *H01L 2224/16145* (2013.01); *H01L 2224/16225* (2013.01); *H01L 2224/16227* (2013.01); *H01L 2224/73204* (2013.01); *H01L 2224/81011* (2013.01); *H01L 2224/81191* (2013.01); *H01L 2224/81193* (2013.01); *H01L 2224/81203* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81466* (2013.01); *H01L 2224/81484* (2013.01); *H01L 2224/81907* (2013.01); *H01L 2224/83192* (2013.01); *H01L 2224/92* (2013.01); *H01L 2224/9211* (2013.01); *H01L 2224/94* (2013.01); *H01L 2924/01322* (2013.01); *H01L 2924/12041* (2013.01); *H01L 2924/1306* (2013.01); *H01L 2924/13091* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 5,346,118 | A | 9/1994 | Degani et al. |
| 5,564,617 | A | 10/1996 | Degani et al. |
| 5,817,545 | A | 10/1998 | Wang et al. |
| 6,121,689 | A * | 9/2000 | Capote ............... B23K 35/025 257/773 |
| 6,131,795 | A * | 10/2000 | Sato ............................. 228/102 |
| 6,324,069 | B1 * | 11/2001 | Weber ................. H01L 21/563 174/260 |
| 7,087,458 | B2 * | 8/2006 | Wang ................... H01L 21/563 257/E21.503 |
| 8,071,470 | B2 | 12/2011 | Khor et al. |
| 2004/0087057 | A1 * | 5/2004 | Wang et al. ................ 438/106 |
| 2004/0169275 | A1 * | 9/2004 | Danvir ................. H01L 21/563 257/737 |
| 2004/0245653 | A1 * | 12/2004 | Lee ..................... H01L 23/4334 257/778 |
| 2009/0008800 | A1 * | 1/2009 | Nakatani ............... H01L 21/563 257/778 |
| 2009/0146301 | A1 * | 6/2009 | Shimizu ................. H01L 24/29 257/738 |
| 2009/0174052 | A1 * | 7/2009 | Sogawa ................. H01L 23/24 257/690 |
| 2009/0174061 | A1 * | 7/2009 | Naka ...................... H01L 24/05 257/698 |
| 2009/0206480 | A1 | 8/2009 | Lam |
| 2009/0267213 | A1 * | 10/2009 | Lin ................... H01L 23/49816 257/687 |
| 2009/0278249 | A1 * | 11/2009 | Jung ................... H01L 21/4853 257/690 |
| 2010/0090369 | A1 * | 4/2010 | Machida ................ B29C 33/56 264/272.11 |
| 2011/0068452 | A1 * | 3/2011 | Kerr ....................... H01L 24/81 257/678 |
| 2012/0241955 | A1 | 9/2012 | Law et al. |

OTHER PUBLICATIONS

DS Hi-Metal Beyond Materials, Epoxy Flux Introduction, pp. 1-33.
Alpha Advanced Materials, Low Temperature Processing, Alpha Low Temperature SMT (Surface Mount Technology) Soldering/Processing, Webpage, http://alphacpmd.com/Products/Solder-Paste/Low-Temperature-Processing, 2013. pp. 1-3.
Superior Flux & Mfg. Co., Material Safety Data Sheet, Superior No. 1265 Paste, Jan. 1, 2012, pp. 1-3.
Superior Flux & Mfg. Co., Superior 1265, Aluminum Paste Flux, 1 page.
Superior Flux & Mfg. Co., Material Safety Data Sheet, Superior AL26-33-75, May 24, 2012, pp. 1-4.
Superior Flux & Mfg. Co., Superior Solder Paste AL-26-33-75, Direct Aluminum Solderpaste Using SN96.5/AG3.5, pp. 1-2.
Avery, William F., Direct Aluminum Soldering Paste, IMAPS Thermal Management 2011 Workshop.
Air Products, Better Process Solutions for Direct Benefits at Test & Assembly, Sep. 13, 2010, pp. 1-24.

* cited by examiner

SEMICONDUCTOR DEVICE AND METHOD OF SIMULTANEOUS MOLDING AND THERMALCOMPRESSION BONDING

CLAIM TO DOMESTIC PRIORITY

The present application claims the benefit of U.S. Provisional Application No. 61/740,379, filed Dec. 20, 2012, which application is incorporated herein by reference.

FIELD OF THE INVENTION

The present invention relates in general to semiconductor devices and, more particularly, to a semiconductor device and method of simultaneous molding and thermocompression bonding of a semiconductor die to a substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1a shows a conventional semiconductor die 10 with bumps 12 formed over contact pads 14 on active surface 16. A flux material 18 is deposited over bumps 12. Substrate 20 includes contact pads 22 formed on surface 24 of the substrate. A flux material 26 is deposited over surface 24 of substrate 20. In FIG. 1b, semiconductor die 10 is bonded to substrate 20 with bumps 12 covered by flux material 18 electrically and metallurgically connected to contact pads 22 covered by flux material 26 on substrate 20. Residual flux material 18 and 26 are removed by a cleaning process. In FIG. 1c, an underfill material 28 is deposited between semiconductor die 10 and substrate 20. The bonding of semiconductor die 10 to substrate 20 occurs during a separate processing step as compared to depositing underfill material 28 between the semiconductor die and substrate.

FIG. 2a shows a conventional semiconductor die 30 with bumps 31 formed over contact pads 32 on active surface 33. A flux material 34 is deposited over bumps 31. Substrate 35 includes contact pads 36 formed on surface 37 of the substrate. A flux material 38 is deposited over surface 37 of substrate 35. In FIG. 2b, semiconductor die 30 is bonded to substrate 35 with bumps 31 covered by flux material 34 electrically and metallurgically connected to contact pads 36 covered by flux material 38 on substrate 35. Residual flux material 34 and 38 are removed by a cleaning process. In FIG. 2c, a mold underfill material 39 is deposited over and between semiconductor die 30 and substrate 35. The bonding of semiconductor die 30 to substrate 35 occurs during a separate processing step as compared to depositing mold underfill material 39 between the semiconductor die and substrate.

FIG. 3a shows a conventional substrate 40 with contact pads 41 and insulating layer 42 formed over a surface of the substrate. A non-conductive paste 43 is deposited over contact pads 41 and insulating layer 42. FIG. 3b shows semiconductor die 44 with bumps 45 formed over contact pads 46 on active surface 47. A heat tip 48 is attached to a back surface of semiconductor die 44. In FIG. 3c, semiconductor die 44 is bonded to substrate 40 with bumps 45 electrically and metallurgically connected to contact pads 41 on substrate 40 using thermocompression or reflow bonding with the aid of heat tip 48. Non-conductive paste 43 is distributed between semiconductor die 44 and substrate 40. The bonding of semiconductor die 44 to substrate 40 occurs during a separate processing step as compared to depositing non-conductive paste 43 over the substrate.

Each of the molding and bonding processes described in FIGS. 1-3 require separate manufacturing steps, which increases time and cost and introduces the potential for handling defects.

SUMMARY OF THE INVENTION

A need exists to simultaneously encapsulate and bond a semiconductor die to a substrate in a manner to achieve high production throughput and low defect rate. Accordingly, in one embodiment, the present invention is a method of making a semiconductor device comprising the steps of providing a substrate, disposing a semiconductor die over the substrate, and simultaneously depositing an encapsulant around the semiconductor die and substrate and bonding the semiconductor die to the substrate.

In another embodiment, the present invention is a method of making a semiconductor device comprising the steps of providing a substrate, disposing a semiconductor die over the substrate, and depositing an encapsulant between the semiconductor die and substrate while bonding the semiconductor die to the substrate.

In another embodiment, the present invention is a semiconductor device comprising a substrate and semiconductor die disposed over the substrate. An encapsulant is deposited around the semiconductor die and substrate simultaneous with bonding the semiconductor die to the substrate.

In another embodiment, the present invention is a semiconductor device comprising a substrate and semiconductor die disposed over the substrate. An encapsulant is deposited between the semiconductor die and substrate while the semiconductor die is bonded to the substrate.

DETAILED DESCRIPTION OF THE DRAWINGS

Figure 1A:
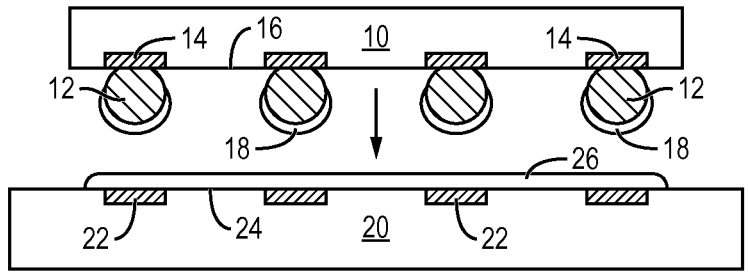
FIGS. 1a-1c illustrate a conventional semiconductor die bonded to a substrate with underfill material.
Figure 1B:
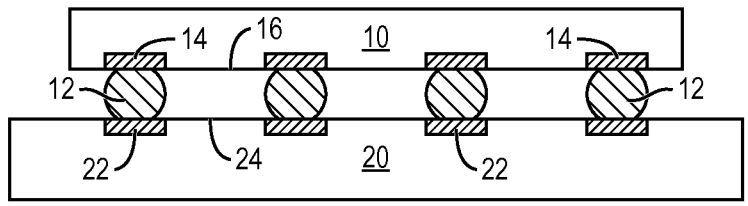
Figure 1C:
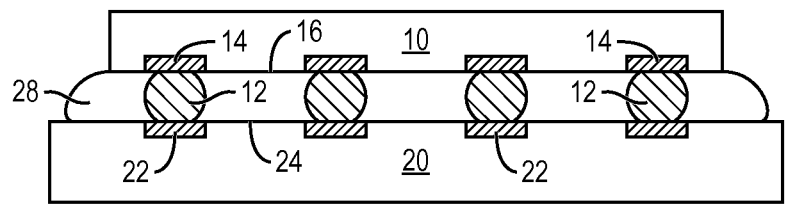
Figure 2A:
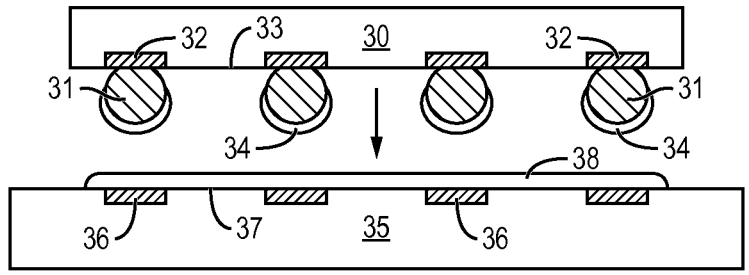
FIGS. 2a-2c illustrate a conventional semiconductor die bonded to a substrate with molded underfill material.
Figure 2B:
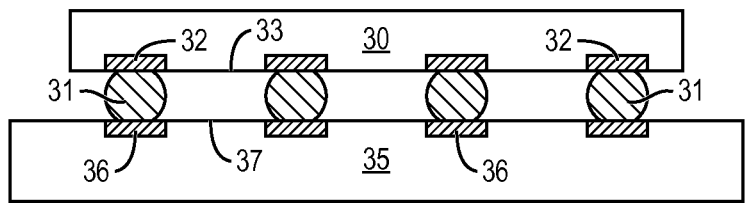
Figure 2C:
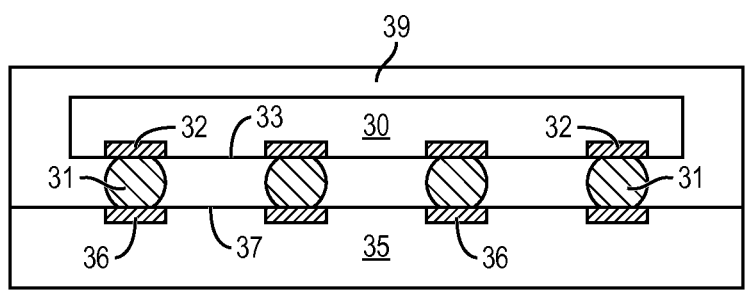
Figure 3A:
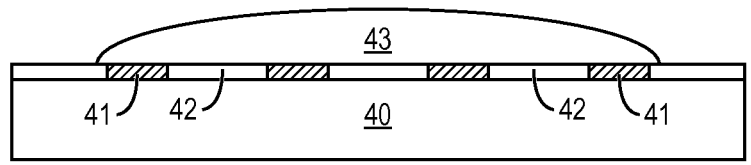
FIGS. 3a-3c illustrate a conventional semiconductor die bonded to a substrate with non-conductive paste.
Figure 3B:
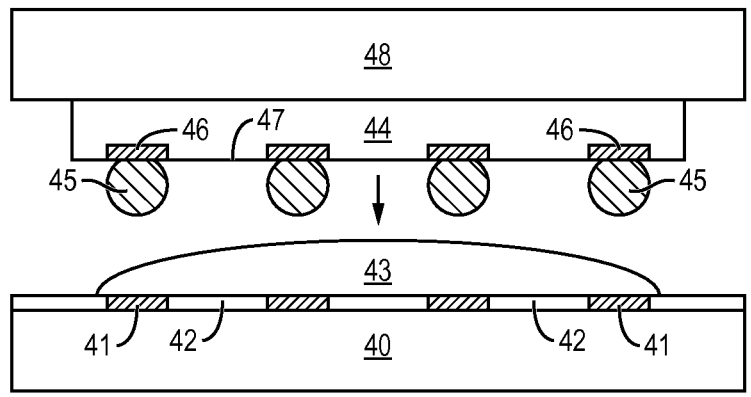
Figure 3C:
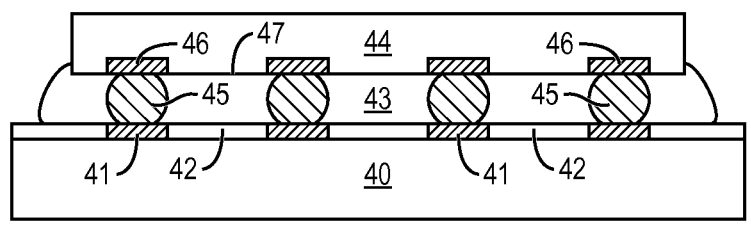

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
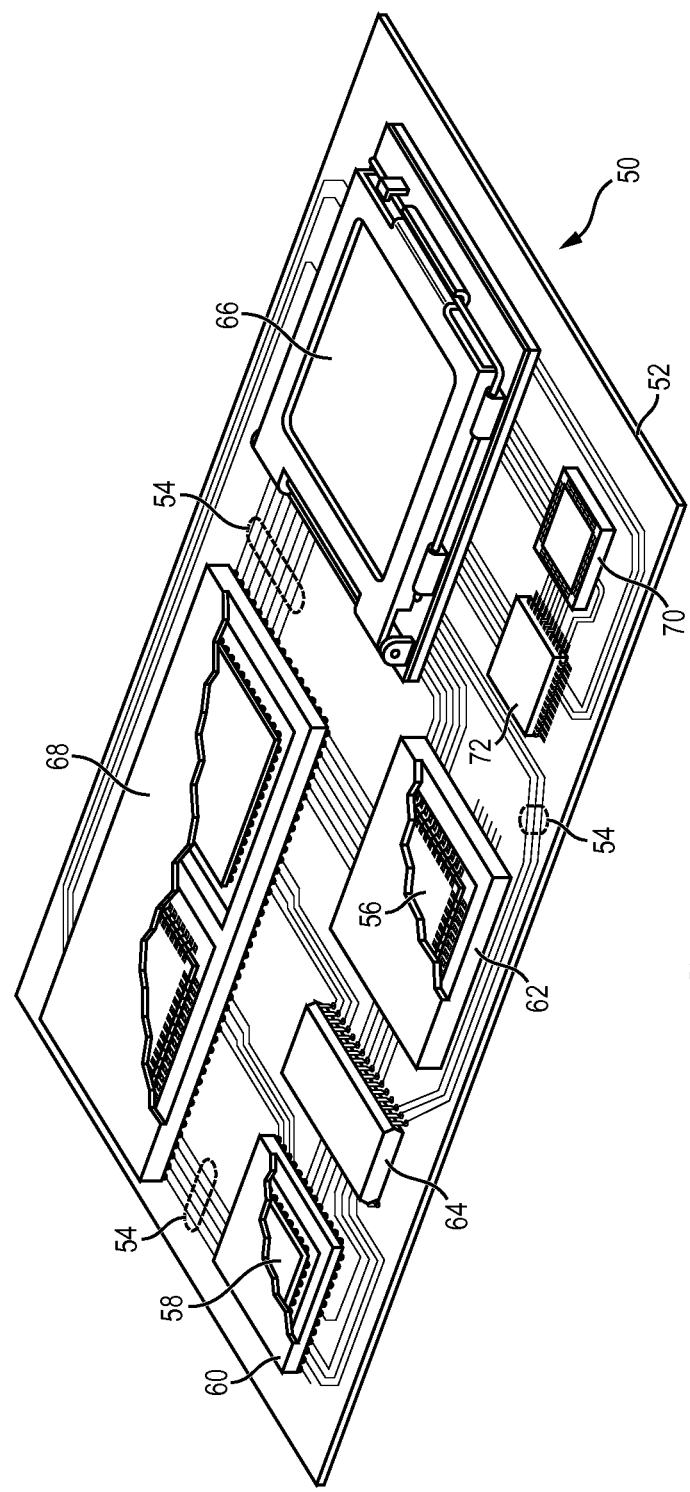
FIG. 4 illustrates a printed circuit board (PCB) with different types of packages mounted to a surface of the PCB.

FIG. 4 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 4 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 5A:
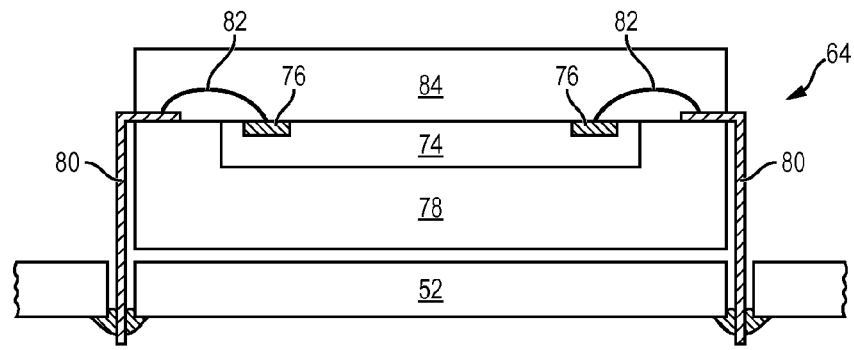
FIGS. 5a-5c illustrate further detail of the representative semiconductor packages mounted to the PCB.
Figure 5B:
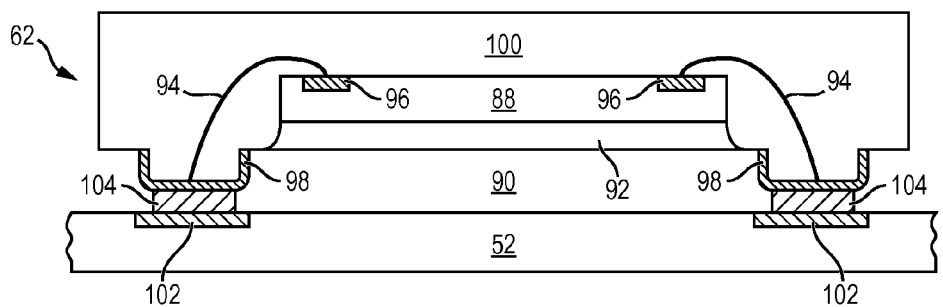
Figure 5C:
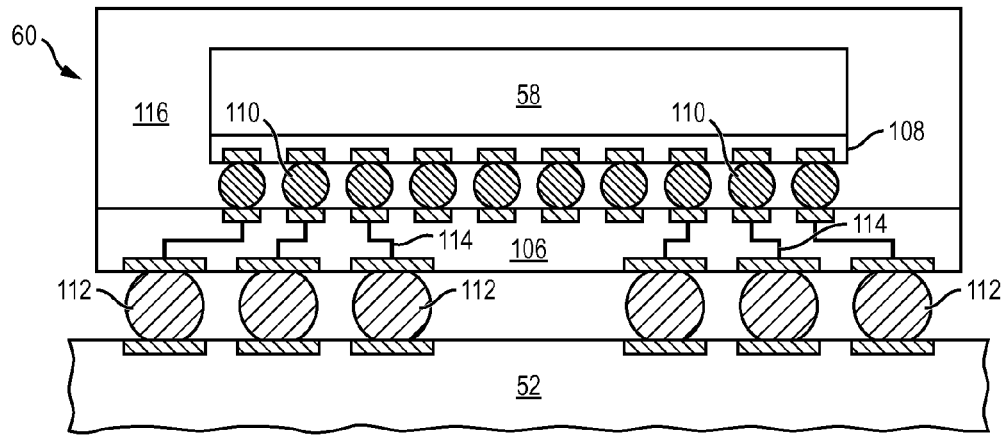

FIGS. 5a-5c show exemplary semiconductor packages. FIG. 5a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 5b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 5c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 6A:
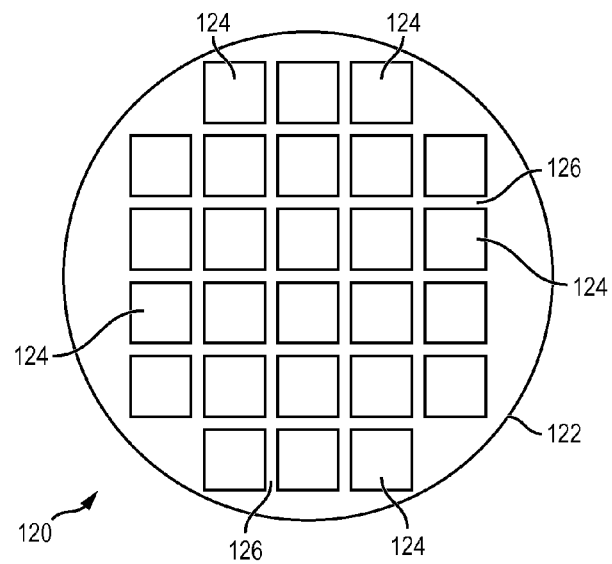
FIGS. 6a-6c illustrate a semiconductor wafer with a plurality of semiconductor die separated by a saw street.

FIG. 6a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 6B:
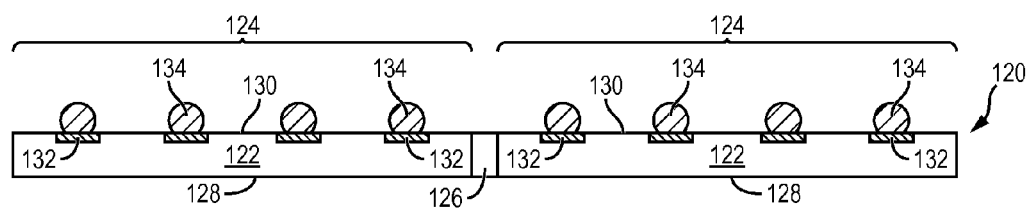

FIG. 6b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 6b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded or thermocompression bonded to contact pads 132. Bumps 134 represent one type of interconnect structure that can be formed over contact pads 132. The interconnect structure can also use stud bump, micro bump, or other electrical interconnect.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or contact pads 132 on each semiconductor die 124 and provides electrical stimuli to the contact pads. Semiconductor die 124 responds to the electrical stimuli, which is measured and compared to an expected response to test functionality of the semiconductor die. The electrical tests may include circuit functionality, lead integrity, resistivity, continuity, reliability, junction depth, electrostatic discharge (ESD), radio frequency (RF) performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 6C:
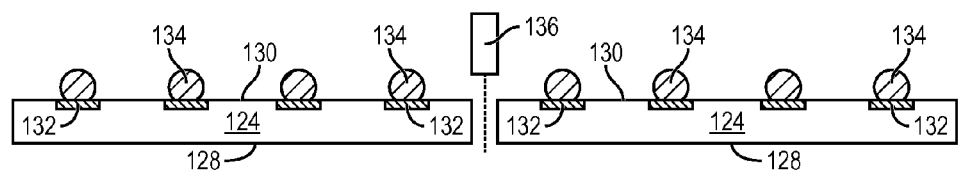

In FIG. 6c, semiconductor wafer 120 is singulated through saw street 126 using a saw blade or laser cutting tool 136 into individual semiconductor die 124. The individual semiconductor die 124 can be inspected and electrically tested for identification of KGD post singulation.

Figure 7A:
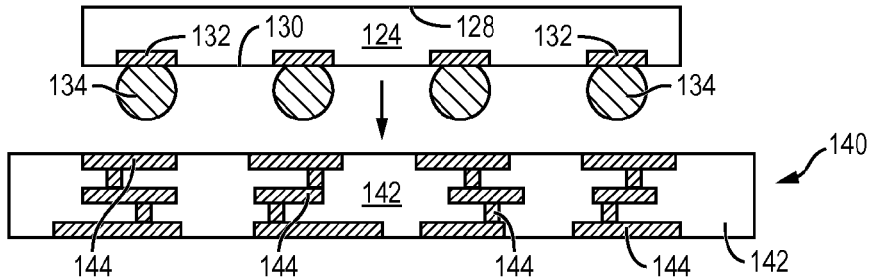
FIGS. 7a-7g illustrate a process of simultaneous MTCB of a semiconductor die bump to a substrate.

FIG. 7a shows a simplified view of substrate or PCB 140 containing insulating material 142 and conductive layers 144. In one embodiment, substrate 140 contains one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Substrate 140 can also be a multi-layer flexible laminate, ceramic, copper foil, glass, or semiconductor wafer including an active surface containing one or more transistors, diodes, and other circuit elements to implement analog circuits or digital circuits. The insulating material 142 may contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), hafnium oxide ($HfO_2$), benzocyclobutene (BCB), polyimide (PI), polybenzoxazoles (PBO), polymer, or other dielectric material having similar structural and insulating properties. Conductive layers 144 contain Al, Cu, Sn, Ni, Au, Ag, Ti, W, or other suitable electrically conductive material formed using a patterning and metal deposition process such as sputtering, electrolytic plating, and electroless plating. Conductive layers 144 include lateral redistribution layers (RDL) and vertical conductive vias to provide electrical interconnect through substrate 140. Portions of conductive layers 144 are electrically common or electrically isolated according to the design and function of the semiconductor die 124 mounted to substrate 140.

Figure 7B:
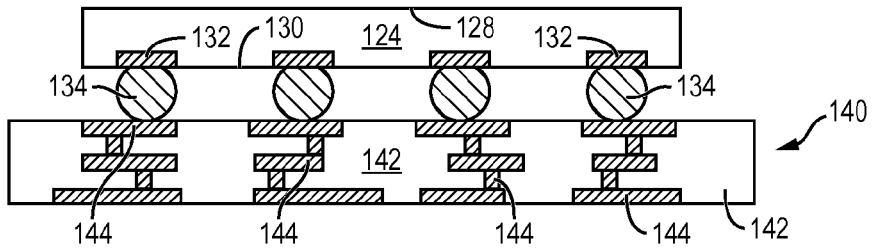

Semiconductor die 124 from FIG. 6c are mounted to substrate 140 using, for example, a pick and place operation with active surface 130 oriented toward the substrate. FIG. 7b shows a simplified view of semiconductor die 124 disposed over substrate 140 with bumps 134 contacting but not yet permanently and metallurgically bonded to conductive layer 144.

Figure 7C:
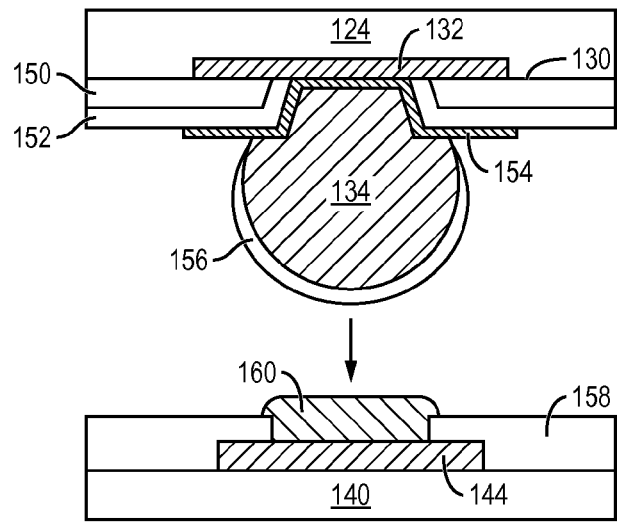

FIG. 7c shows further detail of a portion of semiconductor die 124 and substrate 140 isolated to one bump 134. An insulating or passivation layer 150 is formed over active surface 130 and insulating or passivation layer 152 is formed over insulating layer 150. The insulating layers 150-152 can be formed using PVD, CVD, printing, lamination, spin coating, spray coating, sintering or thermal oxidation. The insulating layers 150-152 contain one or more layers of $SiO_2$, $Si_3N_4$, SiON, $Ta_2O_5$, $Al_2O_3$, or other material having similar insulating and structural properties. A portion of insulating layers 150-152 is removed by an etching process or laser direct ablation (LDA) to expose conductive layer 132.

An electrically conductive layer 154 is formed over conductive layer 132 and insulating layers 150-152 using a patterning and metal deposition process such as sputtering, electrolytic plating, and electroless plating. Conductive layer 154 can be one or more layers of Al, Cu, Sn, Ni, Au, Ag, or other suitable electrically conductive material. Conductive layer 154 operates as an under bump metallization (UBM) layer electrically connected to conductive layer 132. UBM layer 154 includes an adhesion layer, seed layer, and wetting and barrier layer. The adhesion layer 138 can be titanium (Ti), titanium nitride (TiN), titanium tungsten (TiW), Al, or chromium (Cr). The seed layer 146 is formed over the adhesion layer and can be Cu, Ni, NiV, Au, or Al. The wetting and barrier layer is formed over the seed layer and can be Ni, NiV, platinum (Pt), palladium (Pd), TiW, or chromium copper (CrCu). The barrier layer inhibits the diffusion of Cu into the active area of the die. UBM layer 154 aids with adhesion to conductive layer 132.

An epoxy flux material 156 is deposited over bumps 134, e.g., by dipping the bumps in a flux solution. Epoxy flux material 156 has a viscosity of 13000±10% cps, thixotropic index of 3.7±10%, glass transition temperature (Tg) of 75.4° C., coefficient of thermal expansion (CTE) of A1 85.9 ppm and A2 90.1 ppm, storage modulus of 1.9 E+09 Pa, and loss modulus of 3.85 E+09 Pa.

An insulating or passivation layer 158 is formed over substrate 140 using PVD, CVD, printing, lamination, spin coating, spray coating, sintering or thermal oxidation. The insulating layer 158 contain one or more layers of SiO2, Si3N4, SiON, Ta2O5, Al2O3, or other material having similar insulating and structural properties. A portion of insulating layer 158 is removed by an etching process LDA to expose conductive layer 144.

A low temperature solder on pad (SOP), solder paste, or other conductive bonding material 160 is deposited over conductive layer 144 and insulating layer 158. SOP 160 contains a tin silver bismuth (SnAgBi) alloy with melting temperature less than 175° C. In one embodiment, SOP 160 has a melting point of 138° C. under a peak reflow temperature of 170-180° C.

Figure 7D:
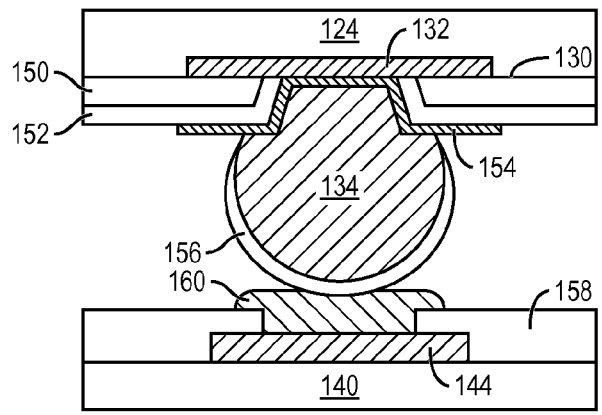

Semiconductor die 124 is positioned over substrate 140 with bump 134, as dipped in flux material 156, aligned to SOP 160 disposed over conductive layer 144. In FIG. 7d, semiconductor die 124 is brought into proximity of substrate 140 with flux material 156 contacting SOP 160 as a temporary bond to hold the semiconductor die and substrate securely in place until the metallurgical bonding of bump 134 to SOP 160 and conductive layer 144 in a later step.

Figure 7E:
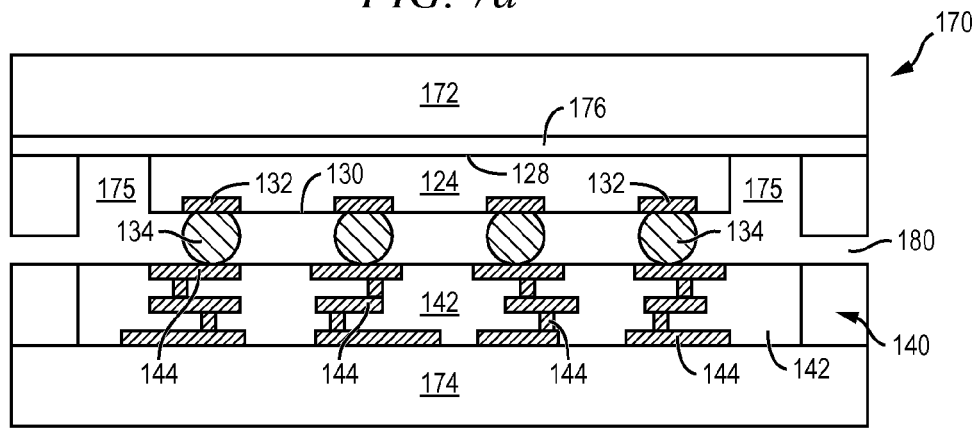
Figure 7F:
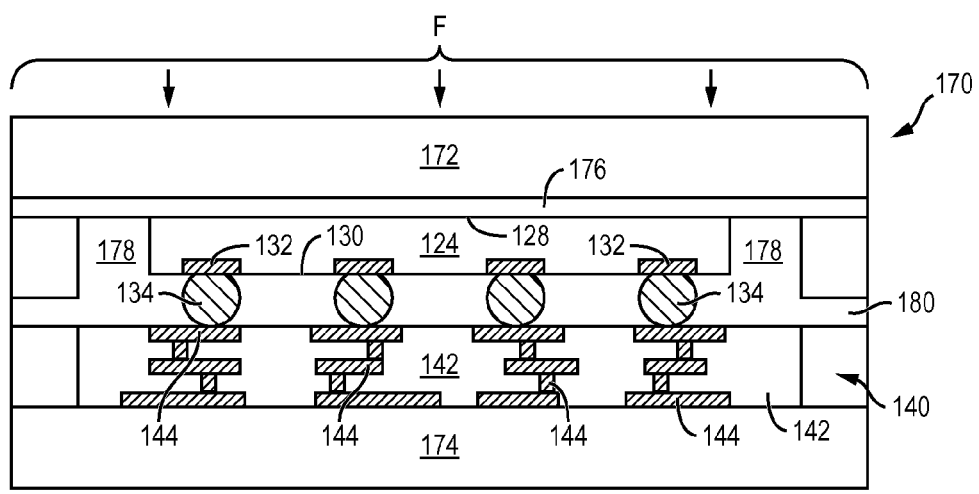

In FIG. 7e, semiconductor die 124 and substrate 140 in the simplified view are placed in chase mold 170. Again, bumps 134 of semiconductor die 124 have not yet been permanently and metallurgically bonded to conductive layer 144 of substrate 140 at the time of placement into chase mold 170. Chase mold 170 includes an upper mold support 172 and lower mold support 174. Chase mold 170 has a cavity 175 for containing semiconductor die 124, substrate 140, and encapsulant or molding compound. Semiconductor die 124 and substrate 140 are placed over lower mold support 174 with a surface of substrate 140, opposite semiconductor die 124, contacting the lower mold support. The upper mold support 172 and lower mold support 174 are brought together to close chase mold 170 with back surface 128 of semiconductor die 124 contacting sealing layer 176 to block formation of encapsulant on the back surface of the semiconductor die. In FIG. 7f, a volume of encapsulant or molding compound 178 is injected under an elevated temperature and pressure through inlet 180 to cover semiconductor die 124 and substrate 140. In particular, encapsulant 178 covers the four side surfaces of semiconductor die 124 and an area between the semiconductor die and substrate as mold underfill. Encapsulant 178 can be a polymer composite material, such as epoxy resin with filler, epoxy acrylate with filler, or polymer with proper filler. The volume of encapsulant 178 is measured according to the space requirements of chase mold cavity 175 less the area occupied by semiconductor die 124 and substrate 140. Encapsulant 178 is evenly dispersed and uniformly distributed under an elevated temperature within chase mold 170 around semiconductor die 124 and substrate 140, as well as between the semiconductor die and substrate. In one embodiment, the mold injection temperature ranges from 160-190° C. with a molding time of 80-200 seconds. The molding cure temperature ranges from 160-190° C. with a molding cure time of 1-5 hours. Encapsulant 178 is non-conductive and environmentally protects the semiconductor device from external elements and contaminants.

Simultaneous with injection and/or curing of encapsulant 178 around and between semiconductor die 124 and substrate 140 in cavity 175 of chase mold 170, as described in FIG. 7f, a force F is applied to upper mold support 172 and/or lower mold support 174 to bond bumps 134 to SOP 160 and conductive layer 144 using thermocompression. That is, bumps 134, SOP 160, and conductive layer 144 are electrically and metallurgically bonded by the application of force and temperature at the same time and during the same processing step as the mold cycling, also referred to herein as molded thermocompression bonding (MTCB). The simultaneous thermocompression bonding and encapsulation including mold underfill reduces manufacturing time and cost because the encapsulation and bonding of semiconductor die 124 to substrate 140 occur at the same time during the same processing step. The temporary bond between epoxy flux material 156 and SOP 160 serves to securely hold semiconductor die 124 to substrate 140 up to the MTCB process. Epoxy flux material 156 and SOP 160 also aids with the metallurgical bond between bumps 134 and conductive layer 144.

Figure 7G:
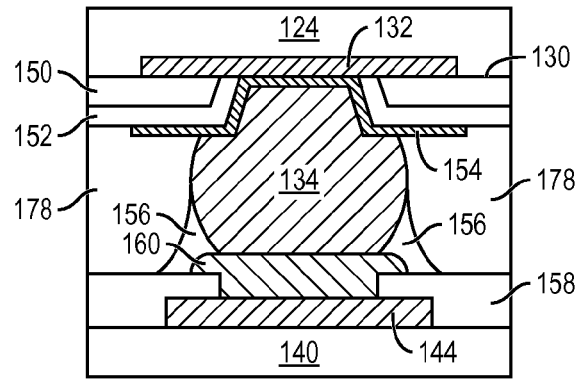

FIG. 7g shows further detail of a portion of semiconductor die 124 and substrate 140 isolated to one bump 134 bonded to SOP 160 and conductive layer 144 after MTCB. Encapsulant 178 is deposited between semiconductor die 124 and substrate 140 at the same time bumps 134 undergo thermocompression bonding to SOP 160 to form the electrical and metallurgical connection to conductive layer 144 of substrate 140. Alternatively, bumps 134 merge with SOP 160 to form the electrical and metallurgical connection to conductive layer 144. Residual flux material 156 is pressed to the side of the union between bumps 134 and SOP 160.

Figure 8:
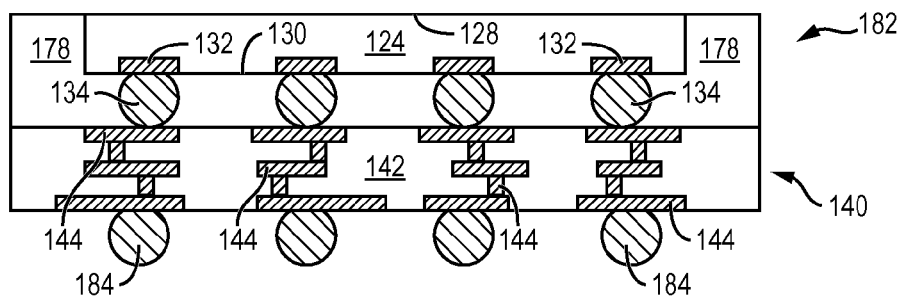
FIG. 8 illustrates a flipchip semiconductor package after MTCB of the semiconductor die to the substrate.

FIG. 8 shows flipchip package 182 in the simplified view containing semiconductor die 124 electrically and metallurgically bonded to substrate 140 and sealed with encapsulant 178 is removed from chase mold 170. If multiple semiconductor die 124 are bonded to substrate 140 as a reconstituted wafer, the wafer is singulated into the individual flipchip packages. Bumps 184 are formed over conductive layer 144 on a surface of substrate 140 opposite semiconductor die 124 for external interconnect. Semiconductor die 124 is electrically connected through bumps 134 and SOP 160 to conductive layer 144 and bumps 184 of substrate 140. The thermocompression bonding of bumps 134 of semiconductor die 124 to conductive layer 144 of substrate 140 simultaneous with the mold underfill of the semiconductor die and substrate in chase mold 170 reduces manufacturing time and cost. The flipchip package 182 may undergo inspection and electrical testing before or after singulation.

Figure 9:
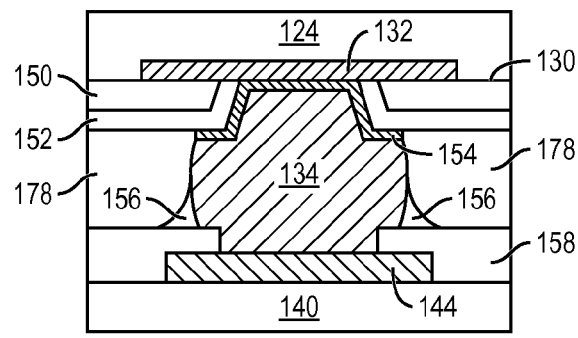
FIG. 9 illustrates simultaneous MTCB of the semiconductor die to the substrate without SOP.

FIG. 9 shows an embodiment, similar to FIG. 7g, of the thermocompression bond between bump 134 of semiconductor die 124 and conductive layer 144 of substrate 140 without SOP 160. Bump 134 is bonded directly to conductive layer 144, e.g., in a surface mount application.

Figure 10:
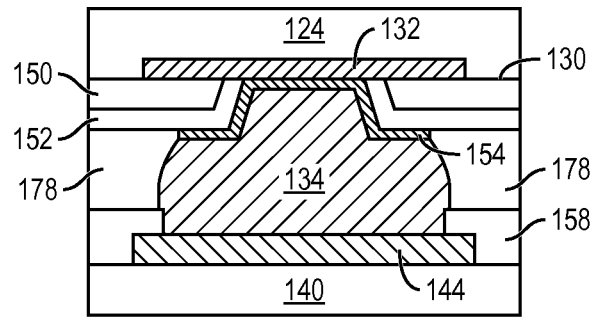
FIG. 10 illustrates simultaneous MTCB of the semiconductor die to the substrate without SOP and flux material.

FIG. 10 shows an embodiment, similar to FIG. 9, of the thermocompression bond between bump 134 of semiconductor die 124 and conductive layer 144 of substrate 140 without flux material 156 and SOP 160. Bump 134 is bonded directly to conductive layer 144, e.g., in a surface mount application.

Figure 11:
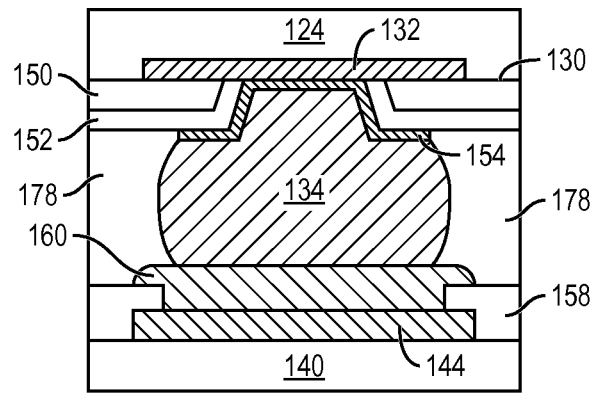
FIG. 11 illustrates simultaneous MTCB of the semiconductor die to the substrate without flux material.

FIG. 11 shows an embodiment, similar to FIG. 7g, of the thermocompression bond between bump 134 of semiconductor die 124 and conductive layer 144 of substrate 140 without flux material 156. Bumps 134 bond to SOP 160 to form the electrical and metallurgical connection to conductive layer 144.

Figure 12:
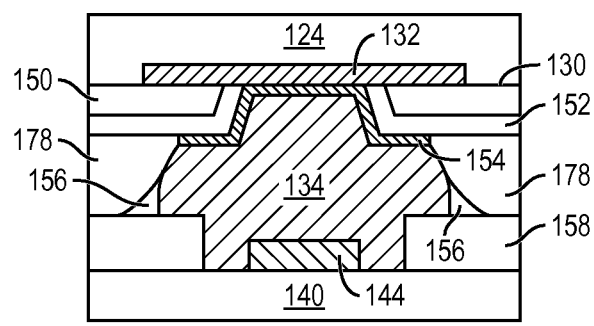
FIG. 12 illustrates simultaneous MTCB of the semiconductor die bump to a narrower conductive layer on the substrate without SOP.

FIG. 12 shows an embodiment of the thermocompression bond between bump 134 of semiconductor die 124 and conductive layer 144 of substrate 140 having a width less than a width of the bump. Flux material 156 is deposited on bump 134, as described in FIG. 7c. In one embodiment, the narrower conductive layer 144 is a trace line formed over substrate 140. Bump 134 is bonded directly to narrower conductive layer 144, e.g., in a non-solder mask defined (NSMD) application.

Figure 13:
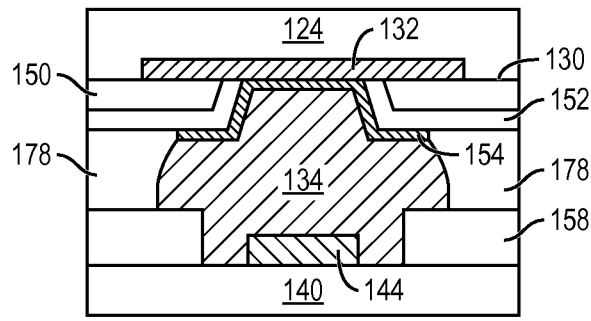
FIG. 13 illustrates simultaneous MTCB of the semiconductor die bump to a narrower conductive layer on the substrate without SOP and flux material.

FIG. 13 shows an embodiment, similar to FIG. 12, of the thermocompression bond between bump 134 of semiconductor die 124 and conductive layer 144 of substrate 140 having a width less than a width of the bump, without flux material 156. In one embodiment, the narrower conductive layer 144 is a trace line formed over substrate 140. Bump 134 is bonded directly to narrower conductive layer 144, e.g., in a NSMD application.

Figure 14A:
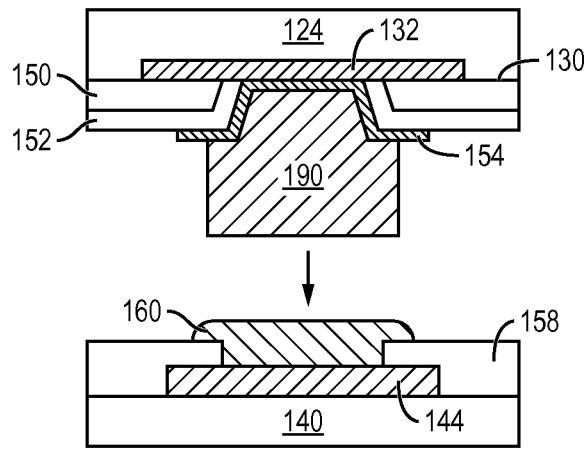
FIGS. 14a-14c illustrate MTCB of a pillar bump on the semiconductor die to the substrate.
Figure 14B:
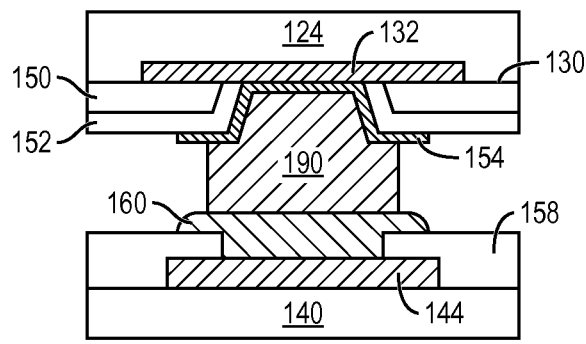
Figure 14C:
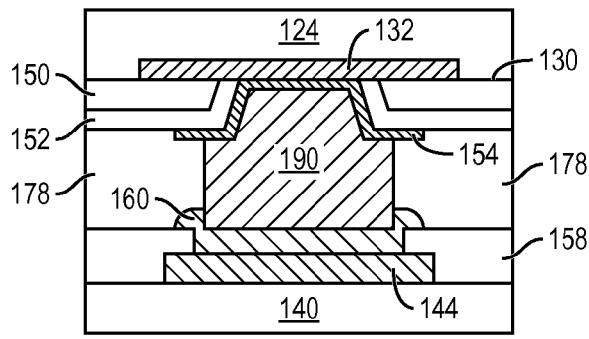

FIG. 14a-14c shows an embodiment of the thermocompression bond between pillar bump 190 of semiconductor die 124 and conductive layer 144 of substrate 140. In FIG. 14a, semiconductor die 124 is positioned over substrate 140 with pillar bump 190 aligned to SOP 160. In FIG. 14b, semiconductor die 124 is brought into proximity of substrate 140 with pillar bump 190 contacting SOP 160 as a temporary bond to hold the semiconductor die and substrate in place until the metallurgical bonding of pillar bump 190 to SOP 160 and conductive layer 144 in a later step, similar to FIG. 7d. In FIG. 14c, pillar bump 190 is bonded to SOP 160 during the mold underfill process to deposit encapsulant 178 around and between semiconductor die 124 and substrate 140 while simultaneously forming the electrical and metallurgical connection to conductive layer 144 by MTCB, as described in FIGS. 7e-7g.

Figure 15:
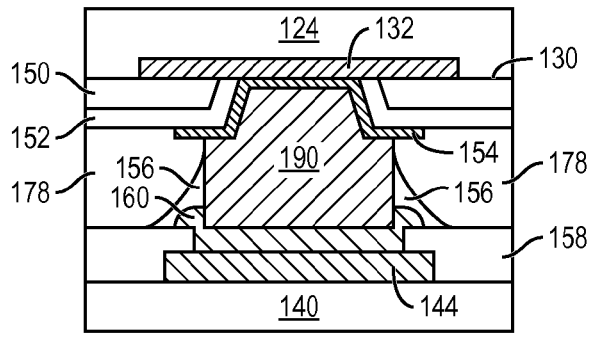
FIG. 15 illustrates simultaneous MTCB of the pillar bump on the semiconductor die to the substrate with flux material.

FIG. 15 shows an embodiment, similar to FIG. 14c, of the thermocompression bond between pillar bump 190 of semiconductor die 124 and SOP 160 to form the electrical and metallurgical connection to conductive layer 144. Flux material 156 is deposited on pillar bump 190, similar to FIG. 7c.

Figure 16A:
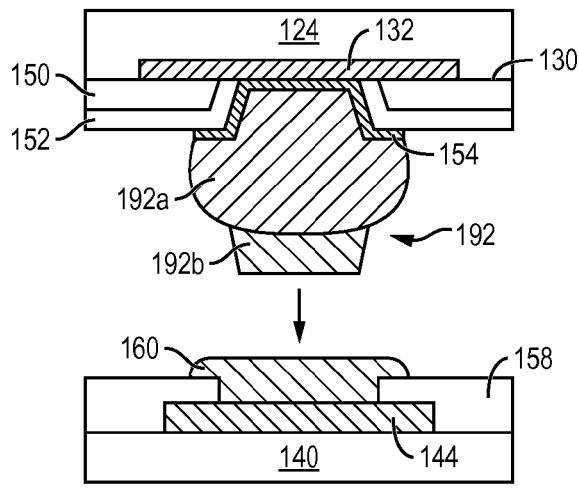
FIGS. 16a-16c illustrate simultaneous MTCB of a stud bump on the semiconductor die to the substrate.
Figure 16B:
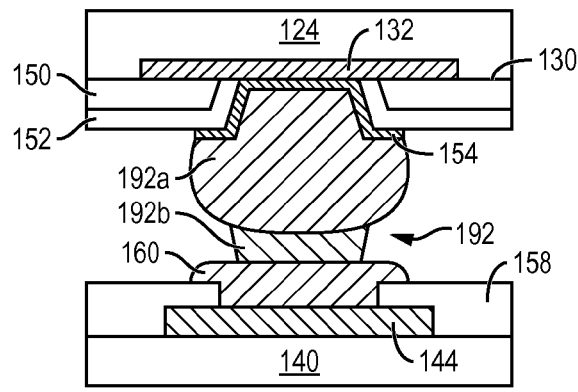
Figure 16C:
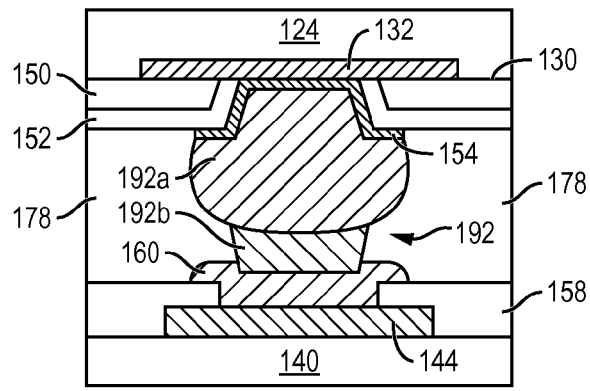

FIG. 16a-16c shows an embodiment of the thermocompression bond between stud bump 192 of semiconductor die 124 and conductive layer 144 of substrate 140. In FIG. 16a, semiconductor die 124 is positioned over substrate 140 with stud bump 192 aligned to SOP 160. Stud bump 192 includes a base portion 192a and stem portion 192b. In FIG. 16b, semiconductor die 124 is brought into proximity of substrate 140 with stud bump 192 contacting SOP 160 as a temporary bond to hold the semiconductor die and substrate in place until the metallurgical bonding of stud bump 192 to SOP 160 and conductive layer 144 in a later step, similar to FIG. 7d. In FIG. 16c, stud bump 192 is bonded to SOP 160 during the mold underfill process to deposit encapsulant 178 around and between semiconductor die 124 and substrate 140 while simultaneously forming the electrical and metallurgical connection to conductive layer 144 by MTCB, as described in FIGS. 7e-7g.

Figure 17:
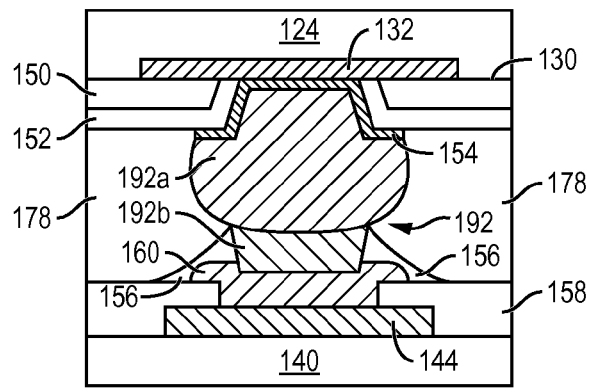
FIG. 17 illustrates simultaneous MTCB of the stud bump on the semiconductor die to the substrate with flux material.

FIG. 17 shows an embodiment, similar to FIG. 16c, of the thermocompression bond between stud bump 192 of semiconductor die 124 and SOP 160 to form the electrical and metallurgical connection to conductive layer 144. Flux material 156 is deposited on stud bump 192, similar to FIG. 7c.

FIGS. 9-17 use the simultaneous MTCB described in FIGS. 7a-7g. The thermocompression bonding of the bumps of semiconductor die 124 to conductive layer 144 of substrate 140 simultaneous with the mold underfill of the semiconductor die and substrate in chase mold 170 reduces manufacturing time and cost and reduces the chance of defects.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing a semiconductor die over the substrate;
   forming an interconnect structure over the semiconductor die; and
   simultaneously depositing an encapsulant around the semiconductor die and over the substrate and reflowing the interconnect structure.

2. The method of claim 1, further including bonding the semiconductor die to the substrate using thermocompression.

3. The method of claim 1, wherein reflowing the interconnect structure bonds the semiconductor die to the substrate.

4. The method of claim 3, wherein the interconnect structure includes a bump, pillar bump, or stud bump.

5. The method of claim 3, further including depositing a flux material over the interconnect structure of the semiconductor die.

6. The method of claim 3, further including:
   depositing a conductive bonding material over the substrate; and
   bonding the interconnect structure to the conductive bonding material.

7. A method of making a semiconductor device, comprising:
   providing a substrate;
   disposing a semiconductor die over the substrate; and
   depositing an encapsulant between the semiconductor die and substrate while applying heat to bond the semiconductor die to the substrate.

8. The method of claim 7, further including bonding the semiconductor die to the substrate using thermocompression.

9. The method of claim 7, further including forming an electrical interconnect structure over the semiconductor die.

10. The method of claim 9, wherein the electrical interconnect structure includes a bump, pillar bump, or stud bump.

11. The method of claim 9, further including depositing a flux material over the electrical interconnect structure of the semiconductor die.

12. The method of claim 9, further including:
    depositing a conductive bonding material over the substrate; and
    bonding the electrical interconnect structure to the conductive bonding material.

13. The method of claim 7, further including:
providing a chase mold;
placing the semiconductor die and substrate in the chase mold;
depositing the encapsulant between the semiconductor die and substrate in the chase mold; and
bonding the semiconductor die to the substrate in the chase mold.

14. A method of making semiconductor device, comprising:
providing a substrate;
mounting a semiconductor die over the substrate;
disposing the mounted semiconductor die and substrate in a chase mold; and
depositing an encapsulant within the chase mold over the mounted semiconductor die and substrate simultaneously with bonding the mounted semiconductor die to the substrate.

15. The method of claim 14, wherein bonding the mounted semiconductor die further includes thermocompression bonding the mounted semiconductor die to the substrate.

16. The method of claim 14, further including forming an electrical interconnect structure over the semiconductor die.

17. The method of claim 16, wherein the electrical interconnect structure includes a bump, pillar bump, or stud bump.

18. The method of claim 16, further including depositing a flux material over the electrical interconnect structure of the semiconductor die.

19. The method of claim 16, further including depositing a conductive bonding material paste over the substrate, wherein the electrical interconnect structure is bonded to the conductive bonding material.

20. A method of making a semiconductor device, comprising:
providing a substrate;
mounting a semiconductor die over the substrate; and
depositing an encapsulant between the semiconductor die and substrate after mounting the semiconductor die and while bonding the semiconductor die to the substrate.

21. The method of claim 20, further including bonding the semiconductor die to the substrate using thermocompression.

22. The method of claim 20, further including forming an interconnect structure over the semiconductor die.

23. The method of claim 22, further including depositing a flux material over the interconnect structure of the semiconductor die.

24. The method of claim 20, further including depositing a conductive bonding material over the substrate.

* * * * *